(12) United States Patent
Rozenblit et al.

(10) Patent No.: US 6,249,190 B1
(45) Date of Patent: Jun. 19, 2001

(54) DIFFERENTIAL OSCILLATOR

(75) Inventors: Dmitriy Rozenblit, Irvine; William J. Domino, Yorba Linda; Mark Oskowsky, San Jose, all of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/386,957

(22) Filed: Aug. 25, 1999

(51) Int. Cl.$^7$ ........................................... H03B 5/12

(52) U.S. Cl. ................... 331/46; 331/36 C; 331/117 R; 331/172; 331/177 R; 331/177 V; 455/262; 455/318

(58) Field of Search ..................... 331/36 C, 46, 331/96, 117 R, 117 FE, 117 D, 116 R, 116 FE, 172, 177 R, 177 V; 455/261, 262, 318

(56) References Cited

U.S. PATENT DOCUMENTS

| 3,939,429 | * | 2/1976 | Lohn et al. ........................ 325/432 |
| 4,527,130 | * | 7/1985 | Lutteke ............................. 331/36 C |
| 5,231,361 | * | 7/1993 | Smith et al. ......................... 331/56 |
| 5,486,796 | * | 1/1996 | Ishikawa et al. ................. 331/117 R |

* cited by examiner

*Primary Examiner*—David Mis
(74) *Attorney, Agent, or Firm*—Lyon & Lyon LLP

(57) ABSTRACT

A differential oscillator based on a first Colpitts oscillator and a mirror image Colpitts oscillator that is coupled to the first Colpitts oscillator. This differential oscillator outputs differential voltage signals that are about 180 degrees out of phase. The differential oscillator may also be adapted to form a voltage controlled oscillator (VCO) such that the differential voltage signals output by the VCO can be varied. A transceiver for telecommunication devices such as cellular phones may use differential oscillators to generate a carrier signal on which a voice or data signal is modulated and the same differential oscillators to assist isolation of the voice or data signal from received signals.

42 Claims, 8 Drawing Sheets

DIFFERENTIAL OSCILLATOR

FIELD OF THE INVENTION

The field of the present invention relates generally to differential oscillators and more specifically, to differential dual Colpitts oscillators.

BACKGROUND OF THE INVENTION

An oscillator generates a periodic signal. Accordingly, an oscillator must have a self-sustaining mechanism that allows its own noise to grow and eventually become a periodic signal. Oscillators having a periodic signal whose frequency falls in the radio frequency range (RF) are often referred to as RF oscillators.

Many RF oscillators use feedback circuits to generate the periodic signal. In these RF oscillators, a frequency-selective network such as an inductor-capacitor (LC) tank is included in the feedback loop in order to stabilize the frequency. The frequency-selective network is also called a "resonator." The nominal frequency of oscillation is often determined by the characteristics of the circuit including, for example, the resonance frequency of the LC tank.

Most discrete RF oscillators incorporate only one active device (e.g., a transistor). There are two reasons for using a one-transistor topology: noise is minimized and costs are reduced.

FIG. 1 illustrates common collector configuration of a traditional Colpitts oscillator that is well known in the art. This Colpitts oscillator has only one transistor, a bipolar junction transistor 12. The transistor 12 has its collector connected to a voltage source $V_{cc}$. The base of the transistor 12 is connected to an inductor 14 via node 16. The inductor 14 has an internal resistance, shown representatively by resistor 18. Resistor 18 is not a resistance separate from the internal resistance of the inductor 14. A resistor 20 is connected between the voltage source $V_{cc}$ and the node 16. Node 16 is also connected to one side of a capacitor 22 and the other side of the capacitor is connected to the emitter of the transistor 12 through nodes 24 and 26. A capacitor 28 is connected between node 24 and ground. A resistor 30 is connected between node 26 and ground.

Such standard Colpitts oscillators are well known and their characteristics have been well studied. Colpitts oscillators behave in a predictable fashion and are easy to implement. Nodes 24 and 26 are physically the same node and carry the output voltage.

One advantage of this Colpitts oscillator is that it has a low output impedance and therefore is less influenced by the circuits which follow it. However, the output signal on node 26 is a single signal. Hence, if the circuit designer requires differential signals, this Colpitts oscillator cannot output such signals. Therefore, there is a need to have an oscillator circuit that can output differential voltage signals which are accurate and have good harmonic content. A signal having good harmonic content is one that has a primary resonant frequency and whose higher order harmonic frequencies are suppressed. It is desirable to have a "balanced" signal, that is, one whose two components are 180 degrees out of phase. Differential voltage signals that are not precisely out of phase result in reduced signal amplitude or phase errors which may degrade the quality of systems that use oscillators. For example, telecommunication and cellular telephone systems that use noisy or inaccurate oscillators may suffer from perceptibly degraded voice qualities.

The phase noise of an oscillator based on a LC tank usually depends on the Q of the tank. The higher the Q of the LC tank, the sharper the resonance and the lower the phase noise skirts. The Q represents how much energy is lost as the energy is transferred from the capacitor to the inductor and vice versa. The Q, phase noise and other attributes of Colpitts oscillators have been well studied and are well known to those of skill in the art.

Oscillators may be used to form other devices including voltage controlled oscillators (VCOs). On a larger scale, oscillators may be used in wireless communication systems such as mobile radio communication systems and cellular telephone systems. Hence, improvements in oscillators lead to improvements in other systems.

SUMMARY OF THE INVENTION

In accordance with the purpose of the invention as broadly described therein, there is provided a differential oscillator.

In particular, a first embodiment of a differential oscillator has a first Colpitts oscillator that is coupled to a mirror image Colpitts oscillator through a coupling network comprising two inductors, a first resistor that is connected between the base of the transistor of the first Colpitts oscillator and the voltage source, and a second resistor that is connected between the base of the transistor of the second Colpitts oscillator and the voltage source.

A second embodiment of the differential oscillator comprises a first Colpitts oscillator that is coupled to a mirror image Colpitts oscillator through a coupling network comprising a cross-coupled transformer having two inductors, two DC blocking capacitors connected to the base of the transistors of the Colpitts oscillators, a first resistor that is connected between the base of the transistor of the first Colpitts oscillator and the voltage source, and a second resistor that is connected between the base of the transistor of the second Colpitts oscillator and the voltage source.

A third embodiment of the differential oscillator comprises a first Colpitts oscillator that is coupled to a mirror image Colpitts oscillator through a coupling network comprising a single inductor and a resistor that is connected between the voltage source and the midpoint of the inductor.

A fourth embodiment of the differential oscillator comprises a first Colpitts oscillator that is coupled to a mirror image Colpitts oscillator through a coupling network comprising two substantially identical inductors and a resistor that is connected between the voltage source and a node between the two inductors.

The differential oscillator may be used to form a VCO. In particular, a first embodiment of such a VCO comprises a first Colpitts oscillator, a mirror image Colpitts oscillator that is coupled to the first Colpitts oscillator through an inductor, and a varactor or variable capacitor coupled across the inductor. A resistor may be connected between the midpoint of the inductor and a voltage source in order to bias the transistors.

A second embodiment of a VCO comprises a first Colpitts oscillator, a mirror image Colpitts oscillator that is coupled to the first Colpitts oscillator through two identical inductors, and two varactors or variable capacitors coupled in series across the inductors. This second embodiment further includes DC blocking capacitors coupled to the varactors and a voltage control signal to control the varactors.

The differential oscillator may be used in any kind of system. For example, it can be used in a multi-band transceiver for transmitting and receiving RF signals in one of a plurality of frequency bands. One embodiment of a transceiver that uses the differential oscillator comprises a transmit circuit which modulates a voice or data signal onto a carrier signal. The carrier signal is a differential very high frequency (VHF) signal outputted from a differential dual Colpitts oscillator, such as the fourth embodiment described above. This modulated carrier signal is filtered and processed and transmitted as a radio frequency signal. The transceiver includes a receiver circuit that receives radio frequency signals and amplifies and filters them. The receiver circuit isolates the voice or data signal from the carrier signal by using filters and mixers. To do so, the receiver circuit uses a differential ultra high frequency (UHF) signal generated by a differential dual Colpitts oscillator, such as the fourth embodiment described above. By using differential voltage signals, the transceiver is more immune to external noise and interference because differential signals tend to cancel the effects of external noise and interference on the transceiver.

A first, separate aspect of the differential oscillator invention is its ability to generate differential voltage signals.

A second, separate aspect of the differential oscillator invention is its ability to generate differential voltage signals that are precisely out of phase by 180 degrees.

A third, separate aspect of the differential oscillator invention is its ability to reject common mode oscillation.

A fourth, separate aspect of the differential oscillator invention is its ability to generate differential voltage signals that are precisely out of phase by 180 degrees while rejecting common mode oscillation.

A fifth, separate aspect of the differential oscillator invention is that it generates differential voltage signals by using only two active devices (e.g., two transistors).

A sixth, separate aspect of the differential oscillator invention is its use of two mirror image Colpitts oscillators.

A seventh, separate aspect of the differential oscillator invention is its use of a first Colpitts oscillator coupled to a mirror image Colpitts oscillator by a low impedance element.

An eighth, separate aspect of the differential oscillator invention is its use of a first Colpitts oscillator coupled to a mirror image Colpitts oscillator by a low impedance element where the two Colpitts oscillators share an inductive element.

A ninth, separate aspect of the differential oscillator invention is its use of a first Colpitts oscillator coupled to a mirror image Colpitts oscillator by a low impedance element where the two Colpitts oscillators each have an inductive element.

A tenth, separate aspect of the invention is a voltage controlled oscillator which generates differential voltage signals accurately.

An eleventh, separate aspect of the invention is a voltage controlled oscillator which generates differential voltage signals that are precisely out of phase and which rejects common mode oscillation.

A twelfth, separate aspect of the invention is a transceiver which uses the differential dual Colpitts oscillator to generate a carrier signal that is more immune from external noise.

A thirteenth, separate aspect of the invention is a transceiver that uses differential dual Colpitts oscillators to generate a carrier signal onto which a voice or data signal is modulated and the same differential dual Colpitts oscillators to assist in isolating the voice or data signal from a received modulated signal.

A fourteenth, seperate aspect of the invention is any of the foregoing aspects, singly or in combination.

DETAILED DESCRIPTION OF THE PREFERRED EMBODIMENTS

Figure 1:
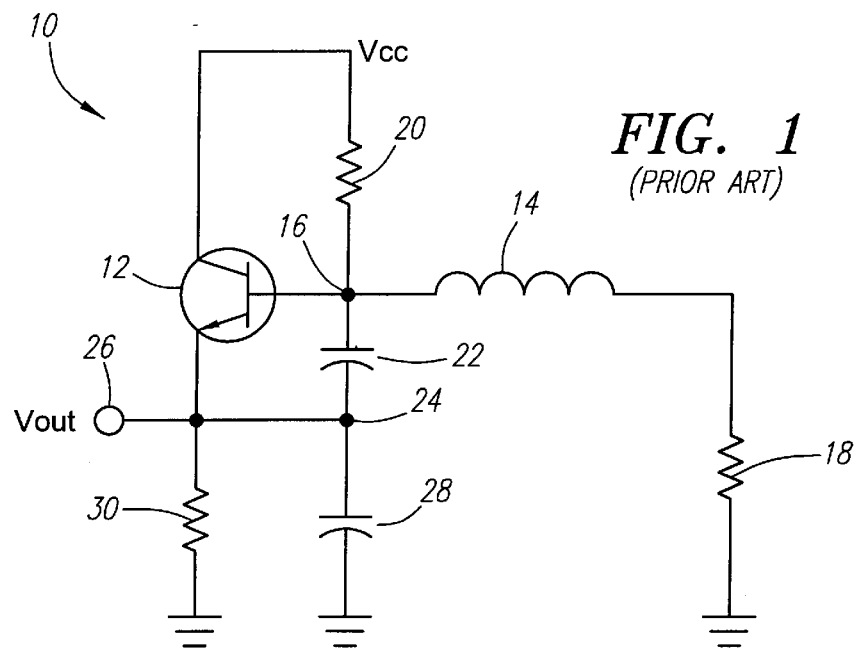
FIG. 1 is a schematic of a traditional Colpitts oscillator known in the prior art.
Figure 2:
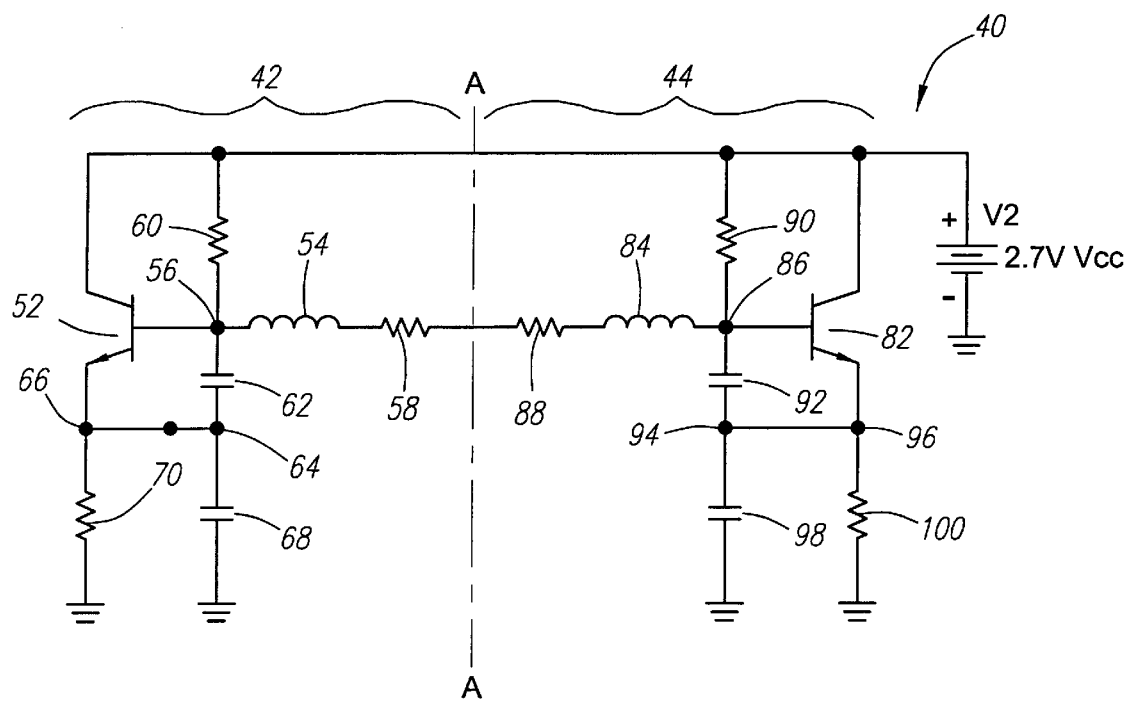
FIG. 2 is a schematic of a first embodiment of a differential oscillator.

FIG. 2 illustrates one embodiment of the differential oscillator invention. Specifically, it is a differential dual Colpitts oscillator comprising first and second Colpitts oscillators which are generally correlated with one another, and which are coupled together through a coupling network. In one example, the differential dual Colpitts oscillator 40 of FIG. 2 comprises a traditional Colpitts oscillator 42 which is coupled to a mirror image Colpitts oscillator 44, that is, an oscillator 44 which is generally correlated with oscillator 42. The dotted line A—A in FIG. 2 illustrates the plane of symmetry between the two Colpitts oscillators and depicts how they are mirror images of each other. In one example, each Colpitts oscillator 42, 44 is the same as the Colpitts oscillator previously shown in FIG. 1.

Specifically, in one example the first Colpitts oscillator 42 comprises a single transistor 52 which may be, for example, a MRF947bipolar junction transistor manufactured by Motorola Corporation. The base of the transistor is connected to one end of an inductor 54 through node 56. Resistor 58 represents the internal resistance of the inductor 54, not a separate resistor. The base of the transistor 52 is also connected via node 56 to a resistor 60. The other end of the resistor 60 is connected to a voltage source $V_{cc}$. A capacitor 62 is connected to the base of the transistor through node 56. The other side of the capacitor 62 is connected to the emitter of the transistor 52 through node 64 which is the same as node 66. A capacitor 68 is connected between node 64 and ground while a resistor 70 is connected between node 66 and ground.

In one example, the mirror image Colpitts oscillator 44 likewise comprises a transistor 82 that is substantially identical to the transistor 52. The base of the transistor 82 is connected through node 86 to an inductor 84. The resistor 88 is the internal resistance of the inductor 84, not a separate resistor. The base of the transistor 82 is also connected to a resistor 90. The other end of the resistor 90 is connected to the voltage source $V_{cc}$. The base of the transistor 82 is further connected to one end of a capacitor 92. The other end of the capacitor 92 is connected through nodes 94, 96 to the emitter of the transistor 82. A capacitor 98 is connected between node 94 and ground while a resistor 100 is connected between node 96 and ground.

While specific values and types of components have been provided below, these are provided only as an example of what those values and components may be. It is not intended to limit the scope of the invention to the specific values of the components, the manner in which the components are connected, or the type of components used. In one implementation, the specific values of each of the components of the differential dual Colpitts oscillator shown in FIG. 2 are as follows: Transistors 52, 82 may be a bipolar junction transistor such as model MRF947/MC manufactured by Motorola Corporation. The inductors 54 and 84 may have an inductance of 33 nano Henry (nH). The internal resistance 58, 88 of the inductors 54, 84 is approximately 3 ohms. The resistors 60, 90 may be 25 k ohms and the resistors 70, 100 may be 0.8 k ohms. The capacitors 62, 92 may have a capacitance of 33 pico Farads (pF). The capacitors 68, 98 may have a capacitance of 22 pF. In this example embodiment illustrated in FIG. 2, the voltage supply $V_{cc}$ is 2.7 volts.

Certain modifications may be made to the circuit of FIG. 2. For example, the inductors 54 and 84 may be combined into one inductor. The combined inductor would then only have one internal resistance. DC blocking capacitors may be added between the inductors and the base of the transistors in order to prevent the base of the transistors from being DC grounded.

Advantageously, the differential oscillator of FIG. 2 produces differential voltage signals which are out of phase with each other. Because real life inductors 54, 84 have internal resistances 58, 88, the differential dual Colpitts oscillator of FIG. 2 oscillates in two modes. It oscillates in its desired fundamental frequency, but it also includes an undesired common mode oscillation. The tendency of node 66 to oscillate in the common mode occurs in the same phase as the tendency of the node 96 to oscillate in the common mode. As a result, the circuit enhances instead of suppresses the common mode oscillation problem. As a consequence, the differential dual oscillator loses energy, with its main differential RF output being suppressed during the low voltage swings of the low frequency common mode output.

Figure 3:
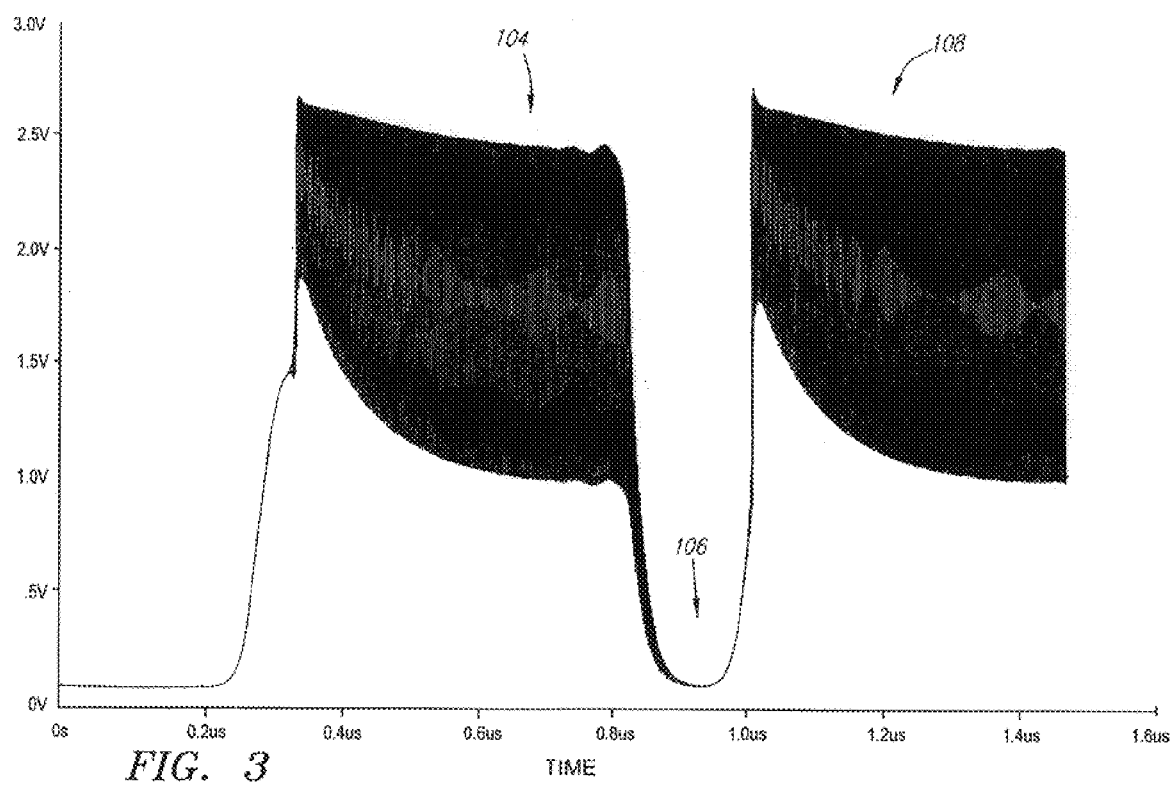
FIG. 3 is a graph of the time response of the differential oscillator of FIG. 2.

The common mode oscillation problem that exists in the differential dual Colpitts oscillator of FIG. 2 is illustrated in the graph of FIG. 3. The horizontal axis depicts the passage of time in microseconds and the vertical axis illustrates the voltage of the differential voltage signals appearing on nodes 66 and 96. Oscillation in the desired fundamental high frequency occurs during the portions of the graph 104, 108. During portions 104, 108 of the graph, the differential voltage signals are sinusoidal and 180 degrees out of phase. In this particular example, the frequency is 300–350 megahertz, but could be roughly 100 megahertz to 1 gigahertz.

However, during portions 102, 106 of the graph, the desired high frequency oscillation disappears and an undesired low frequency oscillation appears. This particular low frequency oscillation appears to be roughly 125 kilohertz. The low frequency oscillation is a common mode oscillation problem because the differential voltage signals are in phase (i.e., move up or down together). As such, the differential voltage signals operate in common mode at low frequencies, which causes the differential voltage to be virtually zero. This common mode oscillation is unpredictable in extent.

Figure 4:
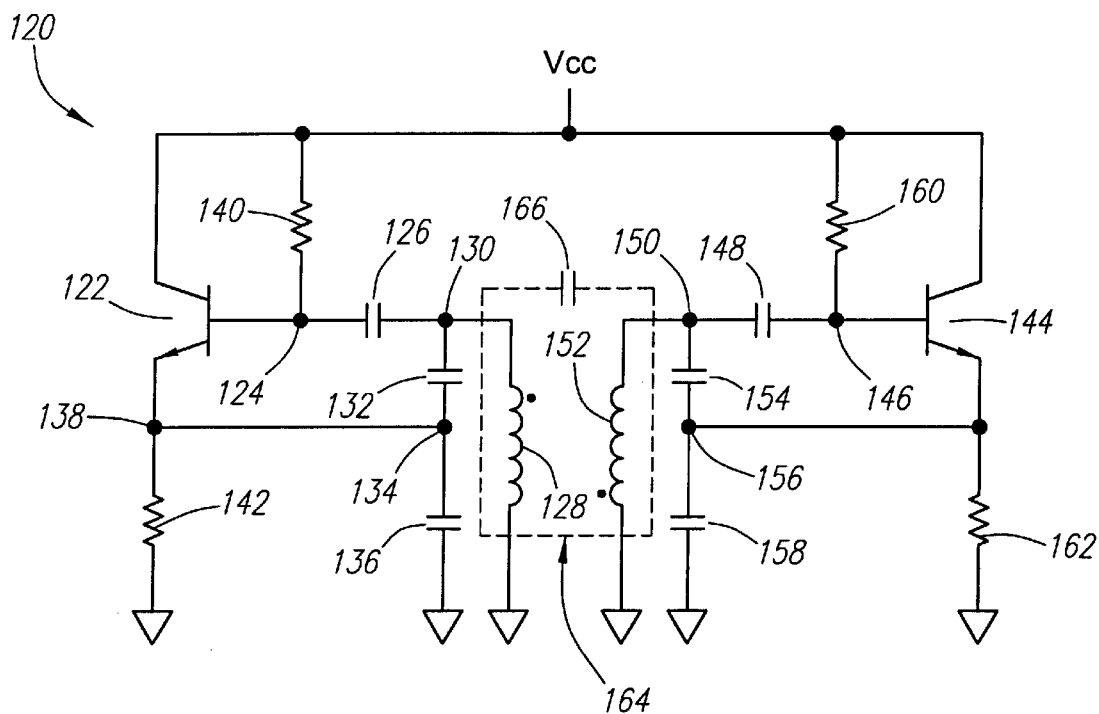
FIG. 4 is a schematic of a second embodiment of a differential oscillator.

FIG. 4 illustrates a second embodiment of the differential dual Colpitts oscillator invention. The differential dual Colpitts oscillator of FIG. 4 is comprised of two Colpitts oscillators that have been coupled together in a master/slave configuration. This differential oscillator generates differential voltage signals from nodes 138 and 156 where the signals are out of phase with each other. In one example, the differential oscillator is comprised of a bipolar junction transistor 122 whose collector is connected to a voltage source $V_{cc}$. The base of the transistor 122 is connected through a node 124 to a capacitor 126. The other end of the capacitor 126 is connected through a node 130 to an inductor 128 and to one end of a capacitor 132. The other end of the capacitor 132 is connected through a node 134 to a capacitor 136 and through a node 138 (same as node 134) to the emitter of the transistor 122. A resistor 140 is connected between the node 124 and the voltage source $V_{cc}$. The capacitor 136 is connected between node 134 and ground. A resistor 142 is connected between node 138 and ground.

In one example, the mirror image Colpitts oscillator on the right hand side of FIG. 4 is comprised of a transistor 144 which is substantially identical to the transistor 122. The collector of the transistor 144 is also connected to the voltage source $V_{cc}$. The base of the transistor 144 is connected through a node 146 to a capacitor 148 and a resistor 160. The other end of the capacitor 148 is connected through a node 150 to an inductor 152 and one end of a capacitor 154. The other end of the capacitor 154 is connected through a node 156 to a capacitor 158, to the emitter of the transistor 144 and to a resistor 162. The remaining ends of the inductor 152, the capacitor 158 and the resistor 162 are connected to ground.

The values of the components in FIG. 4 may be the same as the values in FIG. 2. Capacitors 126 and 148 are DC blocking capacitors which prevent the base of the transistors 122 and 144 from being DC grounded. These transistors require bias to operate and thus, DC grounding is to be avoided. In the alternative, the capacitors 126 and 148 may be moved to the inductor side of the nodes 130, 150 if the capacitance values are large enough. For instance, the capacitors 126, 148 may have a capacitance of 220 pF to 2200 pF.

Effectively, the pair of inductors 128, 152 forms a cross-coupled transformer. In one example, this circuit produces differential voltage signals at nodes 138 and 156 that are precisely 180 degrees out of phase, as desired. This circuit is able to produce such differential signals even with some stray capacitance 166 across the transformer because of the symmetry of the circuit. As can be seen, there is a plane of symmetry between inductors 128 and 152 in FIG. 4. This circuit eliminates the low frequency common mode oscillation problem since the transformer with its opposite-phase windings forces all coupling to be out of phase. Common mode coupling is only possible through the stray capacitance. However, if this capacitance becomes large, the circuit will not oscillate at all because the capacitance effectively shorts out the inductance of the transformer.e Therefore, this embodiment of a differential dual Colpitts oscillator creates differential voltage signals, but may not always be optimal because of the practical undesirability of wirewound transformers.

Figure 5:
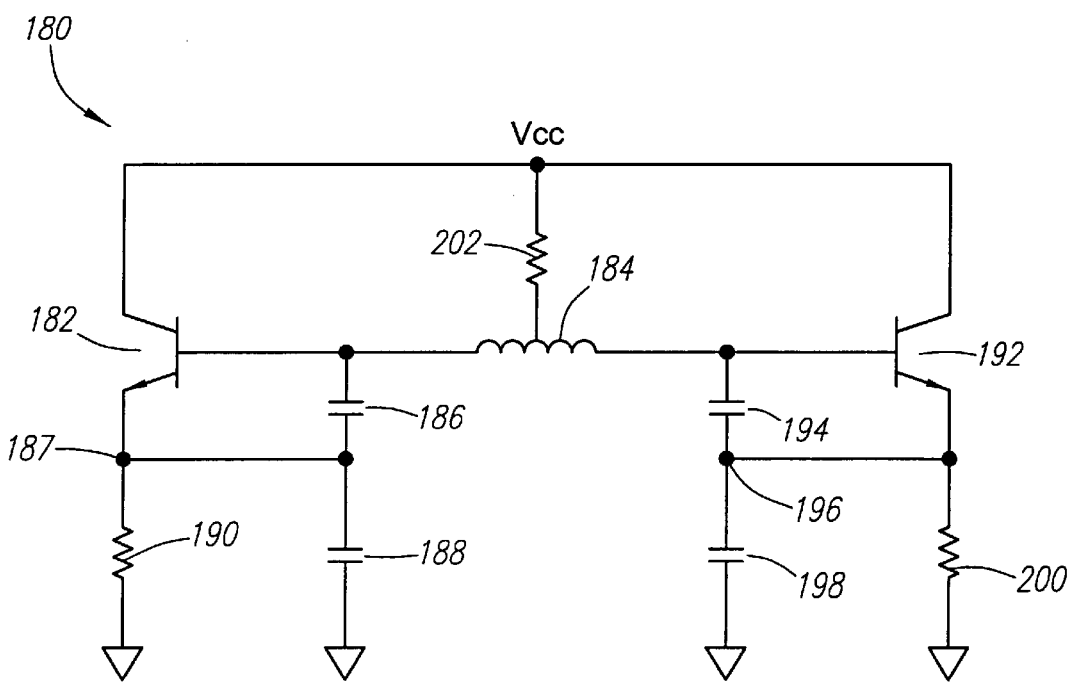
FIG. 5 is a schematic of a third embodiment of a differential oscillator.

FIG. 5 illustrates a third embodiment of the differential oscillator invention. Specifically, FIG. 5 depicts a differential dual Colpitts oscillator 180. In one example, the differential dual Colpitts oscillator 180 essentially comprises two mirror image Colpitts oscillators, with some differences which will become apparent. The transistor 182 may be a bipolar junction transistor. In one example, the transistor 182 has its collector connected to a voltage source $V_{cc}$. The base of the transistor 182 is connected to an inductor 184 and one end of a capacitor 186. The other end of the capacitor 186 is connected through a node 187 to the emitter of the transistor 182, to one end of a capacitor 188 and to a resistor 190. The resistor 190 and the capacitor 188 have their other ends connected to ground.

The transistor 192 also has its collector connected to the voltage source $V_{cc}$. The base of the transistor 192 is connected to the other end of the inductor 184 and to one end of a capacitor 194. The other end of the capacitor 194 is connected through a node 196 to the emitter of the transistor 192, one end of a capacitor 198 and to one end of a resistor 200. The resistor 200 and the capacitor 198 have their other ends connected to ground. Finally, a resistor 202 is connected between the inductor 184 and the voltage source $V_{cc}$. The resistor 202 is connected to the middle of the inductor 184.

It should be noted that the transistors in the differential oscillators described in this patent application may be bipolar junction transistors, mosfet transistors, jfet transistors, or any other kind of transistors. Since the differential oscillators described in this application are based on mirror image oscillators, in one example, the transistors of the oscillators are advantageously the same type of transistor. In other words, if one transistor is a bipolar junction transistor, the transistor in the mirror image oscillator is advantageously also a bipolar junction transistor. Further, the transistors in the two mirror image oscillators in this example are advantageously matched with respect to all their characteristics in order to achieve an accurate 180 degree phase shift.

The values of the components in FIG. 5 may be varied to suit the particular needs of the application. For example, the values could be as follows: the inductor 184 has an inductance of 66 nH, the resistors 190 and 200 have a resistance of 800 ohms, the resistor 202 has a resistance of 30 ohms, the capacitors 186 and 194 have a capacitance of 33 pF and the capacitors 188 and 198 have a capacitance of 22 pF.

Because the differential dual Colpitts oscillator 180 of FIG. 5 eliminates the problems associated with the alternative embodiments as shown in FIGS. 2 and 4, it may be preferred in some circumstances. Like the alternative embodiments of FIGS. 2 and 4, in one example, the differential dual Colpitts oscillator 180 of FIG. 5 is able to output differential voltage signals from the nodes 187 and 196 respectively that are precisely 180° out of phase from each other. Resistor 202 acts as a very low impedance element. However, the very low impedance introduced by resistor 202 at the plane of symmetry of the circuit stops the low frequency common mode of oscillation. It does so without stopping the desired high frequency differential mode of oscillation because the balanced signal exhibits a voltage amplitude of zero at this point. In fact, the resistor 202 could be reduced to zero ohms and the desired high frequency oscillation would still occur, except that the two mirror image Colpitts oscillators would then be completely uncoupled and no longer forced to be 180 degrees out of phase. With a small but non-zero value of the resistor 202, a small amount of coupling between the oscillators forces them to operate in lock-step with a 180 degree phase difference.

The value of the resistor 202 is selected so that the desired differential gain is obtained while also the common mode gain is eliminated. If the value of the resistor 202 is too small, it could undesirably eliminate the desired coupling between the two Colpitts oscillators, effectively acting as a short to AC ground and reducing the circuitry into two independent and separate Colpitts oscillators. on the other hand, if the resistance of the resistor 202 is too large, the circuit might not eliminate enough of the common mode gain, resulting in some undesired common mode oscillation.

Depending on the desired circuit characteristics, the resistor 202 may be selected to be, for example, between 25 and 300 ohms. For low power devices running in the milliwatt range, the resistor 202 can be 30 to 50 ohms for example.

The differential oscillator of FIG. 5 has many advantages. The differential oscillator is simple to implement, has a low output impedance, needs only a small amount of current, creates differential output voltage signals that are about 180 degrees out of phase with each other and have excellent common mode rejection capability. Further, the differential oscillator uses Colpitts oscillators whose individual operating characteristics are well known. For example, the amount of phase shift, noise and other operating characteristics of a Colpitts oscillator are known.

Figure 6:
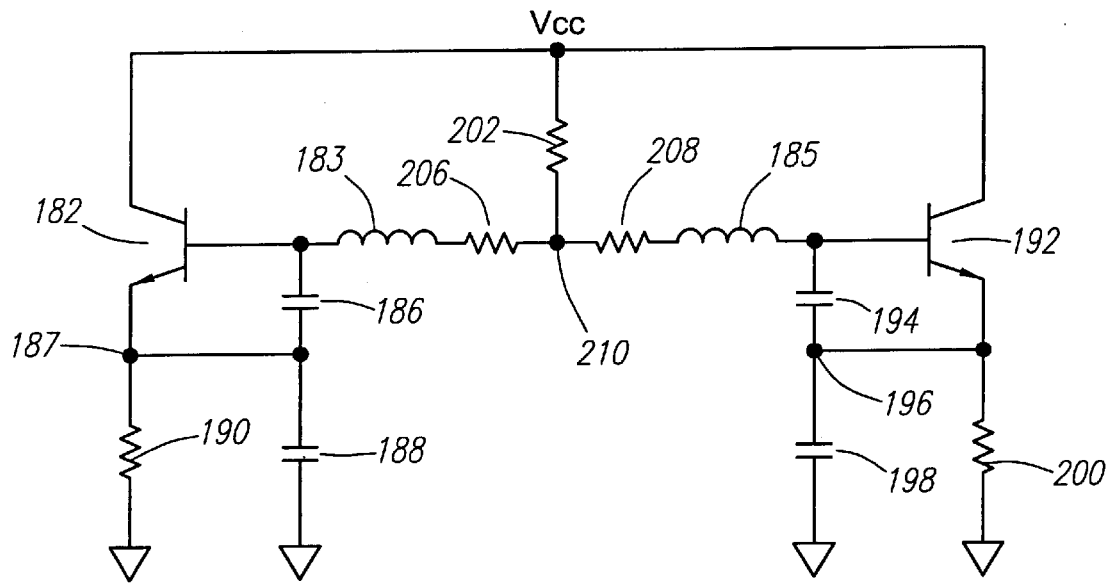
FIG. 6 is a schematic of a fourth embodiment of a differential oscillator.

FIG. 6 is a schematic that illustrates a fourth embodiment of the differential oscillator. It is virtually identical to the differential dual Colpitts oscillator of FIG. 5, but replaces the single inductor 184 with two inductors: a first inductor 183 and a second inductor 185. The first inductor 183 and the second inductor 185 are separated by the node 210 to which the resistor 202 is connected. Rather than connect the resistor 202 to the middle of the inductor 184, the inductor 184 has been split into two equal inductors 183 and 185 and the resistor 202 is connected to the node in between the inductors. This approach simplifies the task of connected the resistor 202 to the middle of the inductor 184. The resistors 206 and 208 represent the internal resistances of the first inductor component 183 and the second inductor component 185 respectively.

While the values of the components of the differential oscillator of FIG. 6 may be changed to suit the particular needs of the application, the values may include those of FIG. 5. Each of the first inductor 183 and second inductor 185 may have an inductance of 33 nH and their internal resistances 206 and 208 may be 3 ohms each.

At times, the circuit designer may want to use an oscillator whose frequency of oscillation is adjustable. For example, telecommunication systems often require the selection of a channel from among many channels because a given transceiver is assigned different carrier frequencies at different times. Thus, the resonant frequency must be adjustable by well-defined steps. If the frequency of oscillation can be varied by a voltage, the circuit is called a voltage controlled oscillator (VCO).

Figure 10:
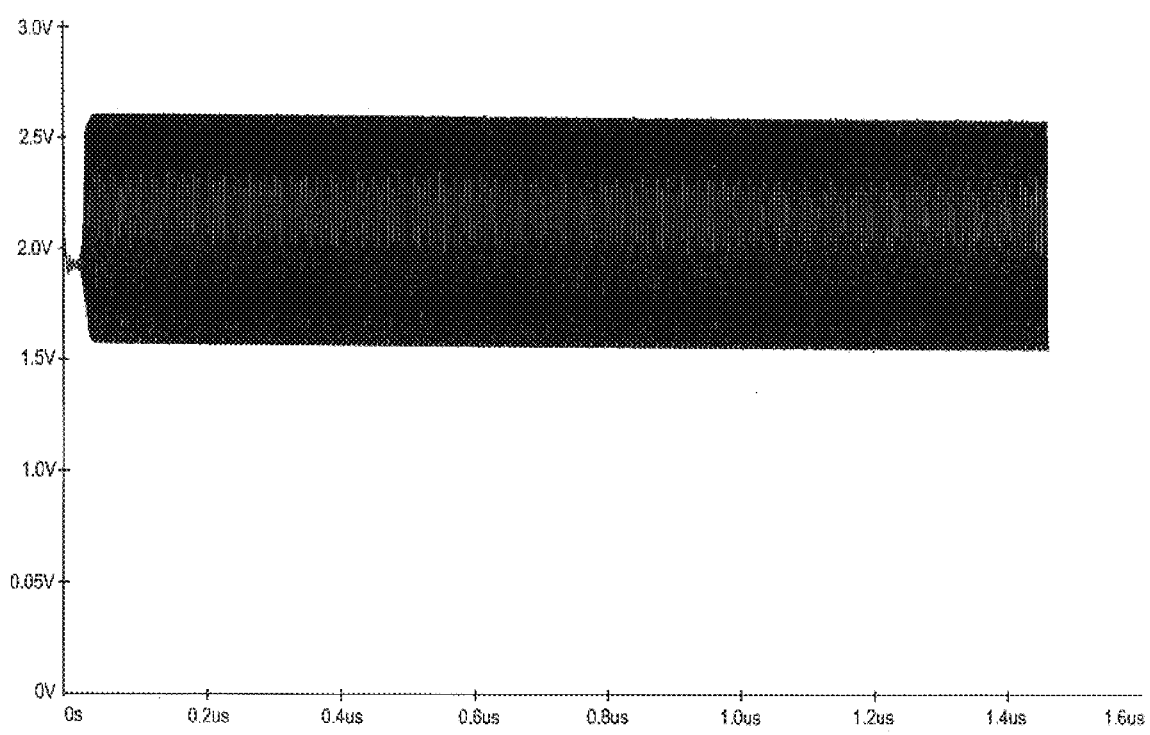
FIG. 10 is a graph of the time response of the differential oscillator of FIG. 6 using the same scale as FIG. 3.
Figure 11:
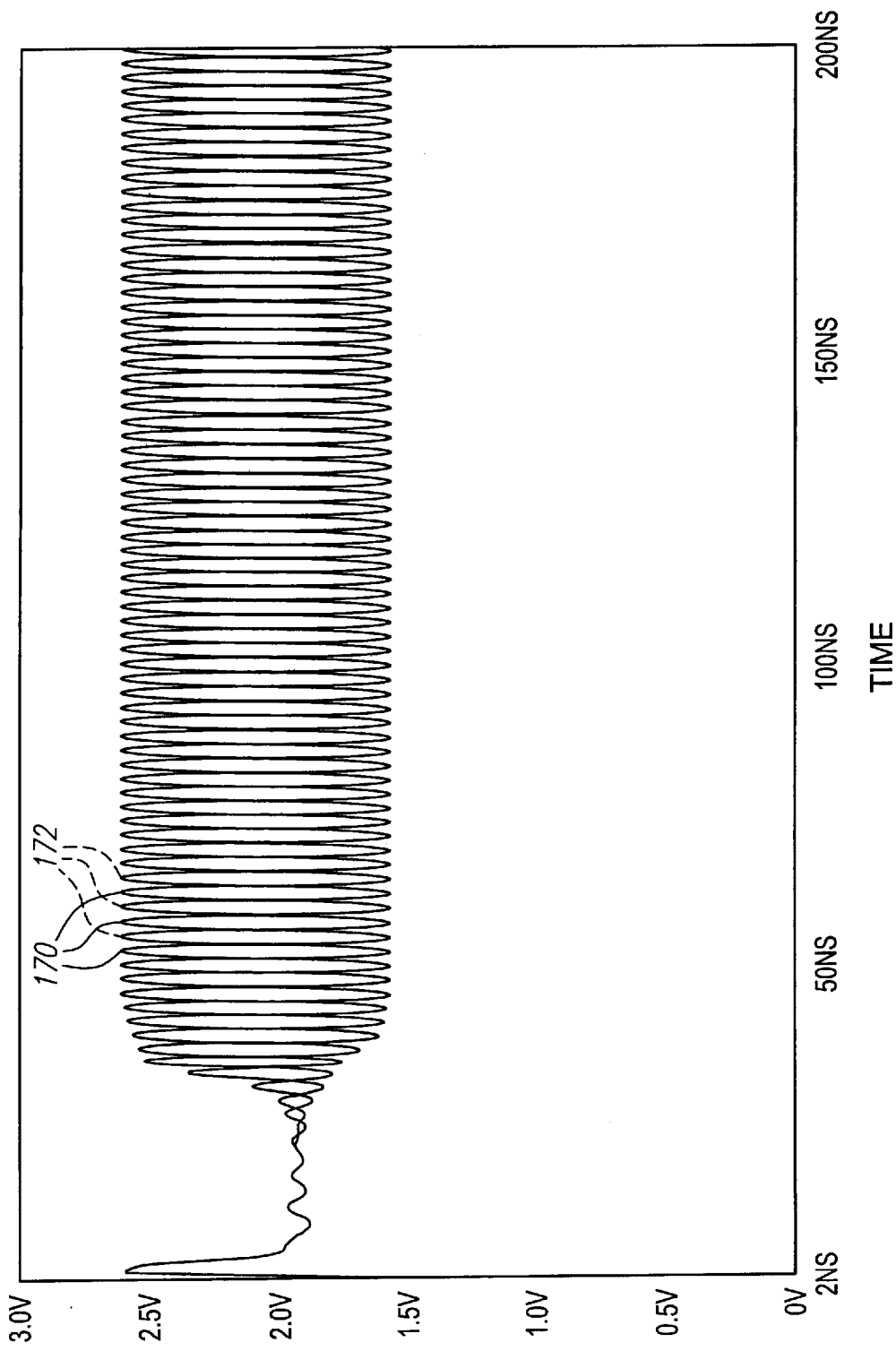
FIG. 11 is a graph of the time response of the differential oscillator of FIG. 6 using a first scale of time which illustrates that the two signals are 180 degrees out of phase.
Figure 12:
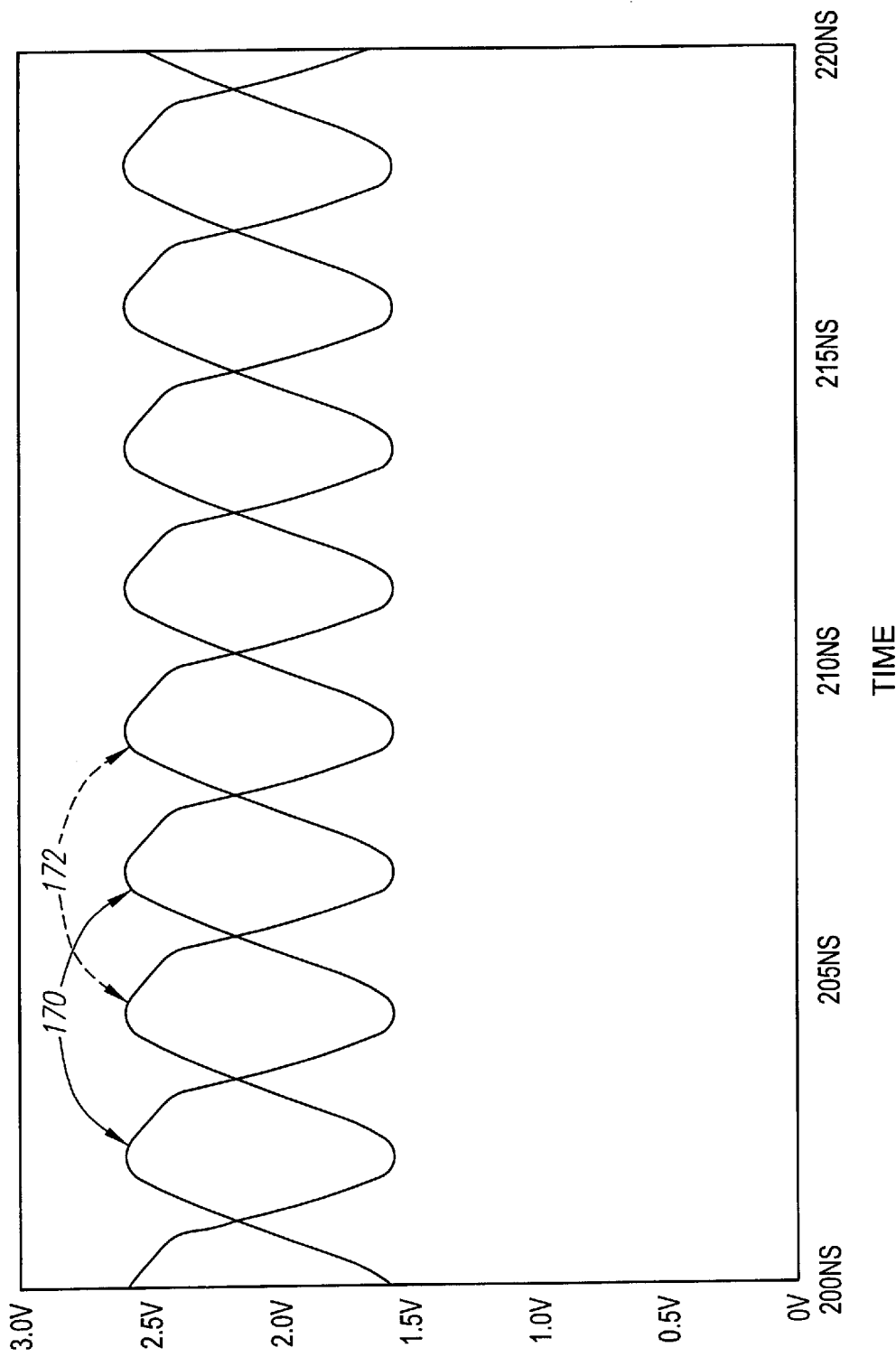
FIG. 12 is a graph of the time response of the differential oscillator of FIG. 6 using a second scale of time which illustrates that the two signals are 180 degrees out of phase.

FIG. 10 is a time response of the differential oscillator of FIG. 6 (which essentially is the differential oscillator of FIG. 5). The horizontal axis depicts the passage of time in microseconds (from zero to 1.6 microseconds) and the vertical axis illustrates the voltage of the differential voltage signals appearing on nodes 187 and 196. As can be seen, oscillation of the differential voltage signals occurs 180 degrees out of phase without the common mode oscillation problem which appears in FIG. 3. FIG. 11 is the time response graph of FIG. 10 but at a different time scale. The horizontal time axis is spread out from 2 nanoseconds to 200 nanoseconds to show that the differential voltage signals 170, 172 occur 180 degrees out of phase. FIG. 12 is another time response graph that shows the graph of FIG. 10 at yet another time scale, spanning from 200 nanoseconds to 220 nanoseconds. Again, FIGS. 11 and 12 show that the oscillation of the differential voltage signals occurs 180 degrees out of phase without the common mode oscillation problem which appears in FIG. 3.

Figure 7:
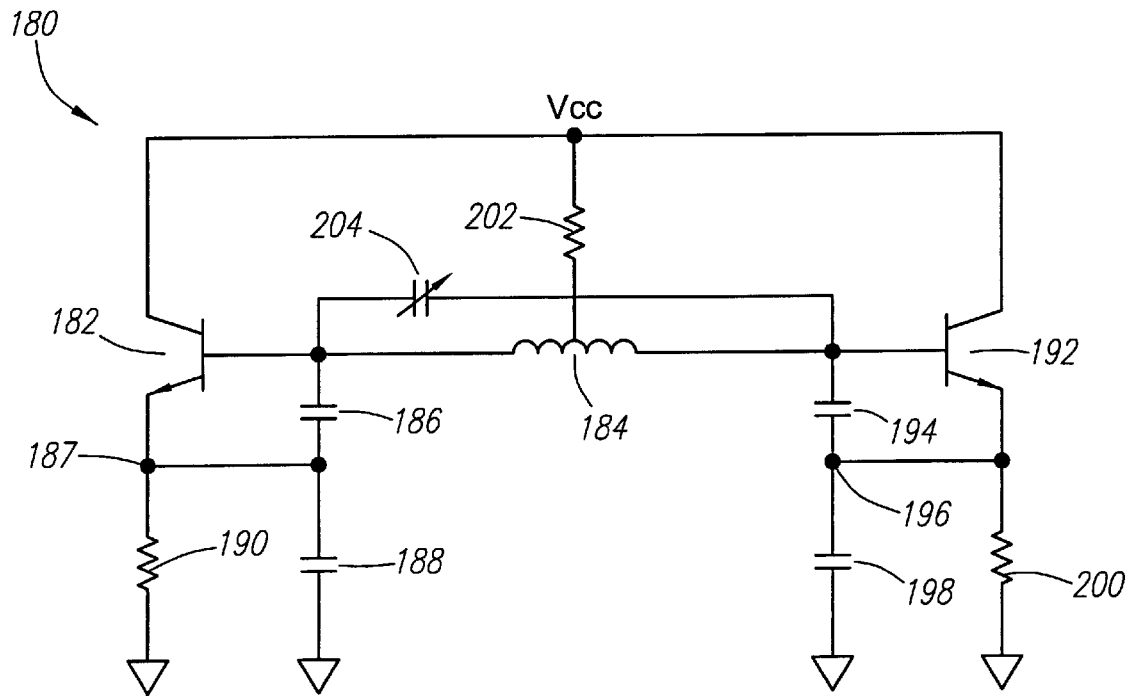
FIG. 7 is a schematic of a first embodiment of a voltage controlled oscillator that uses the differential dual Colpitts oscillator of FIG. 5.

FIG. 7 is a schematic of a first embodiment of a voltage controlled oscillator that is based on the circuit of FIGS. 5. FIG. 7 includes a varactor or variable capacitor 204. Variable capacitor 204 allows one to change the inductance of the inductor 184, and thus the LC tank, so that the resonant frequency of the oscillator can be varied. As a result, through the addition of the variable capacitor 204, the differential dual Colpitts oscillator of FIGS. 5 now behaves as a voltage controlled oscillator (VCO). Alternatively, if the inductor 184 were replaced by two separate inductors, a varactor could be placed in parallel over each of the inductors. Similarly, FIG. 7 could be based on any other embodiment of the differential oscillator previously discussed.

Figure 8:
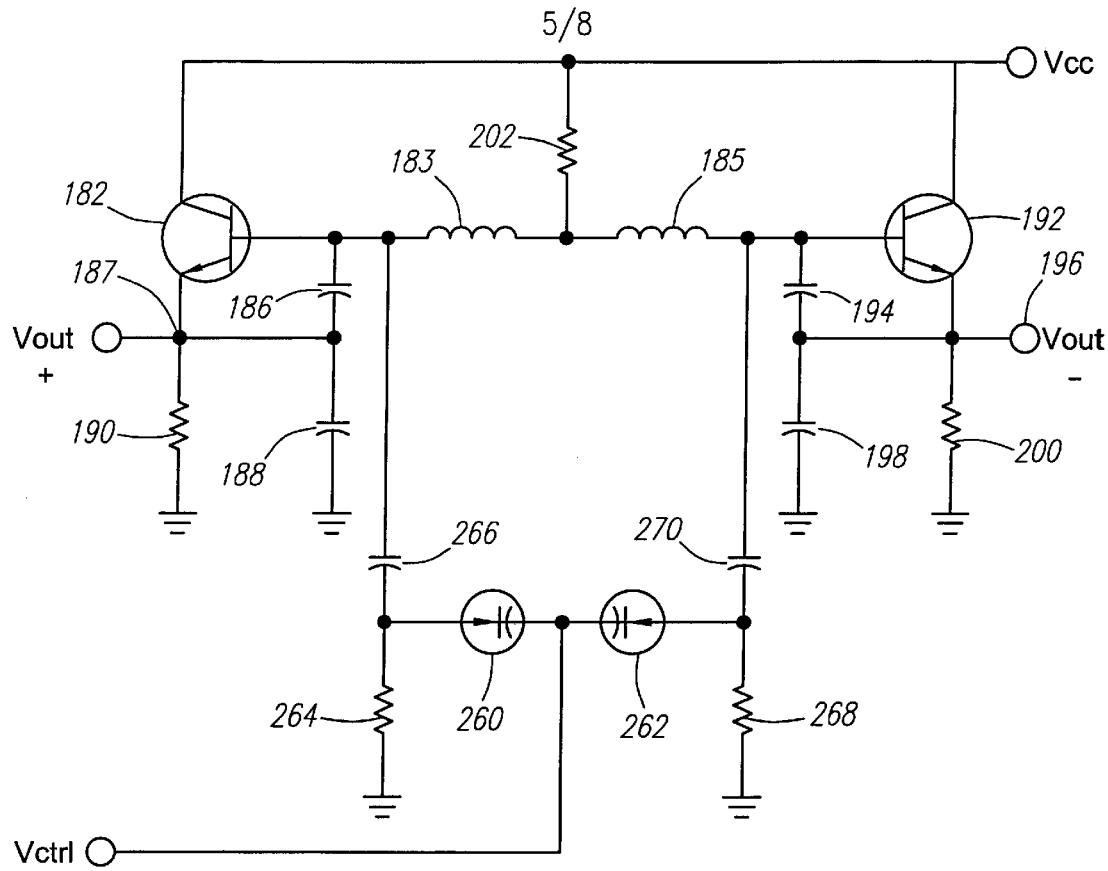
FIG. 8 is a schematic of a second embodiment of a voltage controlled oscillator that uses the differential oscillator of FIG. 6.

FIG. 8 is a second embodiment of a voltage controlled oscillator that is based on the circuit of FIG. 6 where same components have been given the same reference numerals. Notably, FIG. 8 could also be based on any other embodiment of the differential oscillator previously discussed. As can be seen, FIG. 8 has two inductors 183, 185, which could be replaced by a single inductor. FIG. 8 includes two variable capacitors 260, 262; whereas, one example of FIG. 7 only had one variable capacitor. One end of the first variable capacitor 260 is connected to a control signal $V_{ctrl}$ and to one end of the second variable capacitor 262. The other end of the first variable capacitor 260 is connected to a resistor 264 and a capacitor 266. The other end of the resistor 264 is connected to ground, while the other end of the capacitor 266 is connected to the base of the transistor 182. Likewise, one end of the second variable capacitor 262 is connected to the control signal $V_{ctrl}$ and to the first variable capacitor 260. The other end of the second variable capacitor 262 is connected to a resistor 268 and to a capacitor 270. The other end of the resistor 268 is connected to ground, while the other end of the capacitor 270 is connected to the base of the transistor 192.

The capacitors 266 and 270 act as DC blocking capacitors to block $V_{ctrl}$ from having undesired DC paths. The only desired DC path for $V_{ctrl}$ is through resistors 264, 268 to ground. The resistors 264 and 268 completes the DC loop and allows $V_{ctrl}$ to be applied across the variable capacitors 260, 262.

Although the values of the components in FIG. 8 may be changed to suit the particular needs of the application, one set of examples values may include the following. The values of like components as compared to FIG. 6 may have like values. For example, the resistors 264 and 268 may have values in the range of 2k to 5k ohms and the capacitors 266 and 270 may have values in the range of 1 to 100 pF. If the capacitors 266, 270 are made smaller, the varactors 260, 262 have a smaller effect on the frequency of oscillation. By contrast, if the capacitance of capacitors 266, 270 is increased, the effect of the varactors 260, 262 on the frequency of oscillation is increased.

In operation, if one increases the DC voltage applied to $V_{ctrl}$, the capacitance of the varactors 260 and 262 decreases, the capacitance across the inductors 183 and 185 decreases, the total impedance across the LC tank decreases, the effective inductance of the circuit decreases, and the frequency of oscillation increases. By contrast, if one decreases the DC voltage applied to $V_{ctrl}$, the capacitance of the varactors 260 and 262 increases, the capacitance across the inductors 183 and 185 increases, the total impedance across the LC tank increases, the effective inductance of the circuit increases, and the frequency of oscillation decreases.

Alternatively, a first variable capacitor could be placed in parallel over the first inductor 183 and a second variable capacitor placed in parallel over the second inductor 185.

Figure 9:
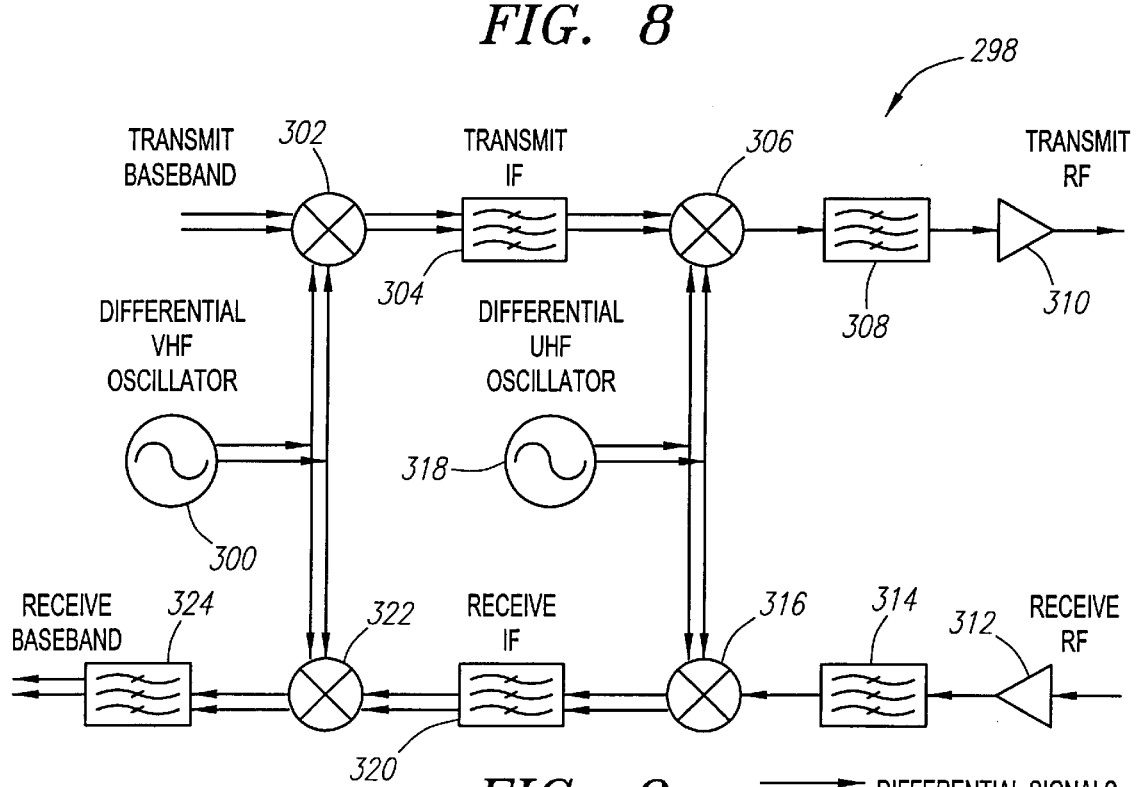
FIG. 9 is a block diagram of a transceiver that uses the differential oscillator.

FIG. 9 illustrates a block diagram of a transceiver that uses the differential oscillator. In fact, this particular transceiver uses two differential dual Colpitts oscillators 300 and 318. The transceiver is particularly suited for a telecommunications device such as a cellular phone of virtually any type. If the cellular phone is a traditional cellular phone, e.g., based on the American Mobile Phone System (AMPS), both the transmit and receive circuits operate at the same time, though at different frequencies. If the cellular phone is based on Global System for Mobile communications (GSM) or Time Division Multiple Access (TDMA), only one of the transmit or receive circuits can be on at a time. Certainly, the cellular phone using the differential oscillator can be based on other systems and variants such as Digital Cellular System at 1800 MHz (DCS-1800) which is GSM operating at 1800 MHz instead of 900 MHz, Interim Standard 136 (IS-136) which is a TDMA system, Code-Division Multiple Access (CDMA or IS-95), or Personal Communications Services (PCS).

Advantageously, this transceiver uses differential signals to achieve greater immunity from external noise and interference. Because external interference is likely to affect internal signals equally or close to equally, the use of a differential signal effectively cancels the external interference. For this reason, the transceiver 298 uses differential signals.

A transmit baseband is an intelligible signal to be sent outside the cellular phone and may include voice or data information. This transmit baseband is sent to a mixer 302 that modulates the baseband signal onto a carrier signal. Actually, the mixer 302 may be any device that modulates the baseband signal onto a carrier signal including, for example, a FM modulator, in-phase and quadrature (IQ) modulator and upconverter. The carrier signal is a very high frequency (VHF) differential signal produced by the differential VHF oscillator 300. The differential VHF oscillator 300 may be any of the differential oscillators described herein and preferably is the differential dual Colpitts oscillator of FIG. 6. VHF ranges roughly from 100 MHz to 400 MHz.

The output of the mixer 302 is a carrier VHF signal modulated with the baseband signal that is received by a passband filter 304. The passband filter 304 only allows certain frequencies to pass through and outputs a "transmit IF" signal. The transmit IF signal is an intermediate frequency signal which is received by another mixer 306. The mixer 306 converts the transmit IF signal into a radio frequency (RF) signal to be transmitted. Mixers create two types of signals: additive signals and subtractive signals. In other words, when a mixer mixes two incoming signals, the mixer outputs a signal whose frequency is the sum of the frequencies of the two incoming signals as well as a second signal whose frequency is the difference of the frequencies of the two incoming signals. Thus, the mixer results in some undesired frequencies. The mixer 306 modulates the filtered signal from the filter 304 onto the differential ultra high frequency (UHF) signal generated by the differential UHF oscillator 318. UHF ranges roughly from 700 MHz to 2 GHz.

The passband filter 308 receives the modulated signal from the mixer 306 and passes only the desired frequencies to a power amplifier 310. The power amplifier transmits the desired frequencies over an antenna (not shown).

At the receiving end of the transceiver 298, signals of varying frequencies are received by the antenna and passed to a low noise amplifier 312. The low noise amplifier 312 amplifies the signals and sends them to a passband filter 314. The passband filter 312 selects a desired frequency or frequencies out of the plurality of incoming frequencies where the desired frequency is expected to carry the voice or data information of interest. For example, the passband filter 312 may select 900 megahertz signals.

The mixer 316 receives the filtered signal from the passband filter 312 and the differential UHF signal from the differential UHF oscillator 318. The mixer 316 uses these signals to demodulate the filtered signals. For example, it converts the 900 MHz signal into a 100 MHz signal. The differential UHF oscillator 318 helps by acting as a tuning oscillator. The oscillator 318 is a differential oscillator of the type described in this patent application and preferably is the differential dual Colpitts oscillator of FIG. 6. The differential UHF oscillator 318 is tuned to generate a specific desired frequency. In using the example provided above, the oscillator 318 may be tuned to generate a 800 MHz signal. As such, the mixer 316 receives the 900 MHz signal from the passband filter 314 and a 800 MHz signal from the differential UHF oscillator 318. The mixer 316 outputs a subtractive signal of 100 MHz and an additive signal of 1700 MHz. These two signals are passed to a passband filter 320 which selects the desired frequency, for example, 100 MHz here.

This approach allows the system to readily use multiple channels for communication. For example, if one wants to change the channel, one simply changes the frequency output from the differential UHF oscillator 318 instead of changing the passband filter 314 to select a different frequency. This arrangement permits the system to use fixed passband filters and yet have multiple channels. For example, if the channel is changed, the passband filter 314 need not be changed to pass 901 MHz instead of 900 MHz. Rather, the differential UHF oscillator 318 is tuned to 801 MHz instead of 800 MHz. The mixer 316 would then take the 901 MHz signal and 801 MHz signal and output a desired 100 MHz signal as the subtractive signal and an extraneous 1702 MHz signal as the additive signal. Therefore, in one example the intermediate frequency is fixed at 100 MHz regardless of the channel the system is tuned to.

The passband filter 320 receives the signal from the mixer 316 and, in this example, would pass the desired 100 MHz signal and block the undesired 1702 MHz signal.

The "receive IF" signal is an intermediate frequency signal that is received by the mixer 322. This signal contains the voice or data signal modulated onto the carrier signal. Voice frequencies usually fall between 200 Hz and 3 kHz. Data frequencies can go higher, up to arbitrarily high frequencies. For example in GSM, the channel bandwidth is currently 200 kHz.

The differential VHF oscillator 300 is tuned to the carrier frequency (e.g., 100 MHz in the first example). The mixer 322 receives the differential VHF signal and the output of the filter 320. The mixer 322 outputs a desired subtractive signal that contains the voice or data signal only as well as an undesired additive signal.

The low pass filter 324 receives the signals from the mixer 322, eliminates the undesired additive signal and allows the desired subtractive signal (e.g., the voice or data signal) to pass through as the receive baseband.

While particular embodiments, implementations, and implementation examples of the present invention have been described above, it should be understood that they have been presented by way of example only, and not as limitations. The breadth and scope of the present invention is defined by the following claims and their equivalents, and is not limited by the particular embodiments described herein.

What is claimed is:

1. A differential oscillator comprising:
    (a) an inductive element;
    (b) a first resistive element coupled to said inductive element and to a voltage source, wherein said first resistive element is coupled to said inductive element at a point between said first and second ends of said inductive element;
    (c) a first oscillator coupled to a first end of said inductive element and generating a first oscillating voltage signal;
    (d) a second oscillator which generally correlates with said first oscillator, said second oscillator being coupled to a second end of said inductive element and generating a second oscillating voltage signal being out of phase with said first oscillating voltage signal.

2. The differential oscillator of claim 1 wherein said first oscillating voltage signal is about 180 degrees out of phase with said second oscillating voltage signal.

3. The differential oscillator of claim 1 wherein said first oscillator is a first Colpitts oscillator and said second oscillator is a second Colpitts oscillator that is a mirror image of said first Colpitts oscillator.

4. The differential oscillator of claim 1 wherein said first oscillator further comprises:
    a load resistance element coupled to ground;
    a first transistor including a first terminal, a second terminal and a third terminal;
    said first terminal is coupled to said voltage source;
    said second terminal is coupled to said first end of said inductive element; and
    said third terminal outputs said first oscillating voltage signal and is coupled to said load resistance element.

5. The differential oscillator of claim 4 wherein said second oscillator further comprises:
    a load resistance element coupled to ground;
    a first transistor including a first terminal, a second terminal and a third terminal;
    said first terminal is coupled to said voltage source;
    said second terminal is coupled to said second end of said inductive element; and
    said third terminal outputs said second oscillating voltage signal and is coupled to said load resistance.

6. The differential oscillator of claim 4 wherein said first oscillator further comprises:
    (a) a first capacitor coupled between said second terminal of said first transistor and said third terminal of said first transistor;
    (b) a second capacitor coupled between said third terminal of said first transistor and ground; and
    (c) a second resistive element coupled between said third terminal of said first transistor and ground.

7. The differential oscillator of claim 6 wherein said mirror image oscillator further comprises:
 (a) a third capacitor coupled between said second terminal of said second transistor and said third terminal of said second transistor;
 (b) a fourth capacitor coupled between said third terminal of said second transistor and ground; and
 (c) a third resistive element coupled between said third terminal of said second transistor and ground.

8. The differential oscillator of claim 4 wherein said first transistor is a bipolar junction transistor;
 said first terminal of said first transistor is the collector of said first transistor;
 said second terminal of said first transistor is the base of said first transistor; and
 said third terminal of said first transistor is the emitter of said first transistor.

9. The differential oscillator of claim 8 wherein
 said second transistor is a bipolar junction transistor;
 said first terminal of said second transistor is the collector of said second transistor;
 said second terminal of said second transistor is the base of said second transistor; and
 said third terminal of said second transistor is the emitter of said second transistor.

10. The differential oscillator of claim 3 wherein said first Colpitts oscillator further comprises:
 (a) a first capacitor coupled between said second terminal of said first transistor and said third terminal of said first transistor;
 (b) a second capacitor coupled between said third terminal of said first transistor and ground; and
 (c) a second resistive element coupled between said third terminal of said first transistor and ground; and
said second Colpitts oscillator further comprises:
 (a) a third capacitor coupled between said second terminal of said second transistor and said third terminal of said second transistor;
 (b) a fourth capacitor coupled between said third terminal of said second transistor and ground; and
 (c) a third resistive element coupled between said third terminal of said second transistor and ground.

11. The differential oscillator of claim 5 further comprising:
 a first DC blocking capacitor coupled to said second terminal of said first transistor and to said inductive element;
 a second DC blocking capacitor coupled to said second terminal of said second transistor and to said inductive element.

12. A differential oscillator comprising:
 (a) an inductive element;
 (b) a first resistive element coupled to said inductive element and to a voltage source;
 (c) a first oscillator coupled to a first end of said inductive element and generating a first oscillating voltage signal;
 (d) a second oscillator which generally correlates with said first oscillator, said second oscillator being coupled to a second end of said inductive element and generating a second oscillating voltage signal being out of phase with said first oscillating voltage signal; and
 (e) wherein said inductive element comprises a first inductor and a second inductor;
  said first inductor is connected to said second inductor at a node;
  said first resistive element is connected to said node;

said first oscillator is coupled to said first inductor; and
 said mirror image oscillator is coupled to said second inductor.

13. A differential oscillator comprising:
 a first resistive element coupled to ground;
 a second resistive element coupled to ground;
 a first transistor having a first terminal, a second terminal and a third terminal, said first terminal being coupled to a voltage source and said third terminal being coupled to said first resistive element;
 a second transistor being substantially identical to said first transistor, said second transistor having a fourth terminal, a fifth terminal and a sixth terminal, said fourth terminal being coupled to said voltage source and said sixth terminal being coupled to said second resistive element;
 an inductive element having a first end coupled to said second terminal of said first transistor and a second end coupled to said fifth terminal of said second transistor;
 said first resistive element coupled to said inductive element and to said voltage source, wherein said first resistive element is coupled to said inductive element at a point between said first and second ends of said inductive element.

14. The differential oscillator of claim 13 further comprising:
 a first capacitor coupled to said second terminal and said third terminal of said first transistor;
 a second capacitor coupled between said third terminal of said first transistor and connected to ground;
 a third capacitor coupled to said second terminal and said third terminal of said second transistor;
 a fourth capacitor coupled between said third terminal of said second transistor and connected to ground;
 a second resistive element coupled to said third terminal of said first transistor and connected to ground; and
 a third resistive element coupled to said third terminal of said second transistor and connected to ground.

15. A differential oscillator comprising:
 a first resistive element coupled to ground;
 a second resistive element coupled to ground;
 a first transistor having a first terminal, a second terminal and a third terminal, said first terminal being coupled to a voltage source and said third terminal being coupled to said first resistive element;
 a second transistor being substantially identical to said first transistor, said second transistor having a fourth terminal, a fifth terminal and a sixth terminal, said fourth terminal being coupled to said voltage source and said sixth terminal being coupled to said second resistive element;
 an inductive element having a first end coupled to said second terminal of said first transistor and a second end coupled to said fifth terminal of said second transistor;
 whereby said inductive element further comprises a first inductor connected to a second inductor at a node; and said first resistive element is connected to said node and is coupled to said voltage source;
 whereby the voltage the voltage signal on said third terminal of said first transistor oscillates at a phase which is about 180 degrees out of phase with the voltage signal on said sixth terminal of said second transistor.

16. A differential oscillator comprising:
 (a) an inductive element;
 (b) a first Colpitts oscillator circuit including a first resistive element coupled to ground, wherein said first resistive element is coupled to said inductive element at a point between said first and second ends of said inductive element;

a first transistor having a first terminal, a second terminal and a third terminal;

said first terminal is coupled to a voltage source;

said second terminal is coupled to said inductive element;

said third terminal is coupled to said first resistive element and carrying a first oscillating voltage signal;

(c) a second Colpitts oscillator which generally correlates with said first Colpitts oscillator, said second Colpitts oscillator having a second resistive element coupled to ground;

a second transistor having a fourth terminal, a fifth terminal and a sixth terminal;

said fourth terminal is coupled to a voltage source;

said fifth terminal is coupled to said inductive element;

said sixth terminal is coupled to said second resistive element and carrying a second oscillating voltage signal, where said first oscillating voltage signal is about 180 degrees out of phase with said second oscillating voltage signal.

17. A differential oscillator comprising:

a first resistive element coupled to ground;

a first transistor having a first terminal, a second terminal and a third terminal, said first terminal is coupled to a voltage source, said third terminal is coupled to said first resistive element;

a first inductor having a first end coupled to said second terminal of said first transistor;

a second resistive element coupled to ground;

a second transistor substantially identical to said first transistor, said second transistor having a first terminal, a second terminal and a third terminal, said first terminal is coupled to a voltage source, said third terminal is coupled to said second resistive element;

a second inductor having a first end coupled to said second terminal of said second transistor;

said first resistive element connected to said second terminal of said first transistor and coupled to said voltage source;

said second resistive element connected to said second terminal of said second transistor and coupled to said voltage source;

said third terminal of said first transistor outputs a first oscillating voltage signal, said third terminal of said second transistor outputs a second oscillating voltage signal that oscillates at a phase about 180 degrees out of phase with said first oscillating voltage signal;

wherein said first inductor is connected to said second inductor at a node;

said first resistive element is connected to said node;

said first oscillator is coupled to said first inductor; and said mirror image oscillator is coupled to said second inductor.

18. The differential oscillator of claim 17 wherein said first inductor has a second end connected to ground and said second inductor has a second end connected to ground.

19. The differential oscillator of claim 17 wherein said first inductor has a second end coupled to the second end of said second inductor.

20. The differential oscillator of claim 17 further comprising:

(a) a first capacitor coupled between said second terminal of said first transistor and said third terminal of said first transistor;

(b) a second capacitor coupled to said third terminal of said first transistor and connected to ground;

(c) a third capacitor coupled between said second terminal of said second transistor and said third terminal of said second transistor;

(d) a fourth capacitor coupled to said third terminal of said second transistor and connected to ground;

(e) a third resistive element coupled to said third terminal of said first transistor and connected to ground; and (f) a fourth resistive element coupled to said third terminal of said second transistor and connected to ground.

21. A voltage controlled oscillator comprising;

(a) an inductive element;

(b) a first resistive element coupled to said inductive element and to a voltage source;

(c) a first oscillator coupled to one end of said inductive element, said first oscillator outputting a first oscillating voltage signal;

(d) a second oscillator which generally correlates with said first oscillator, said second oscillator being coupled to the other end of said inductive element and outputting a second oscillating voltage signal that is about 180 degrees out of phase with said first oscillating voltage signal;

(e) a variable capacitance element coupled across said inductive element, where varying the capacitance of said variable capacitance element changes the frequency of oscillation of said first and second oscillating voltage signals;

(f) wherein said inductive element comprises a first inductor and a second inductor;

said first inductor is connected to said second inductor at a node;

said first resistive element is connected to said node;

said first oscillator is coupled to said first inductor; and said mirror image oscillator is coupled to said second inductor.

22. The voltage controlled oscillator of claim 21 wherein said variable capacitance element is a varactor.

23. The voltage controlled oscillator of claim 21 wherein said variable capacitance element is a variable capacitor.

24. The voltage controlled oscillator of claim 21 wherein said variable capacitance element is coupled across said first inductor.

25. The voltage controlled oscillator of claim 21 wherein said variable capacitance element is coupled across both said first inductor and said second inductor.

26. The voltage controlled oscillator of claim 21 wherein said variable capacitance element comprises a first variable capacitance element and a second variable capacitance element;

said first variable capacitance element is coupled across said first inductor and not coupled across said second inductor; and said second variable capacitance element is coupled across said second inductor and not coupled across said first inductor.

27. The voltage controlled oscillator of claim 21 wherein said variable capacitance element comprises a first variable capacitance element and a second variable capacitance element;

said first variable capacitance element and said second variable capacitance element are coupled in series across both said first inductor and said second inductor.

28. The voltage controlled oscillator of claim 21 wherein said first oscillator further comprises (a) a first resistive element coupled to ground;

(b) a first transistor having a first terminal, a second terminal and a third terminal;

(c) said first terminal is coupled to said voltage source;
(d) said second terminal is coupled to another end of said inductive element;
(e) said third terminal outputs said first oscillating voltage signal and is coupled to said first resistive element;

said second oscillator further comprises
(a) a second resistive element coupled to ground;
(b) a second transistor that is substanially identical to said first transistor, said second transistor having a fourth terminal, a fifth terminal and a sixth terminal;
(c) said fourth terminal is coupled to said voltage source;
(d) said fifth terminal is coupled to another end of said inductive element;
(e) said sixth terminal is coupled to said second resistive element and outputs said second oscillating voltage signal, said second oscillating voltage signal being about 180 degrees out of phase with said first oscillating voltage signal.

29. The voltage controlled oscillator of claim 28 further comprising:
(a) a first capacitor coupled between said second terminal of said first transistor and said third terminal of said first transistor;
(b) a second capacitor coupled between said third terminal of said first transistor and connected to ground;
(c) a third capacitor coupled between said fifth terminal of said second transistor and said sixth terminal of said second transistor;
(d) a fourth capacitor coupled between said sixth terminal of said second transistor and connected to ground; and
(e) a second resistive element coupled between said third terminal of said first transistor and connected to ground;
(f) a third resistive element coupled between said sixth terminal of said second transistor and connected to ground.

30. The voltage controlled oscillator of claim 28 further comprising:
a first DC blocking capacitor coupled to said second terminal of said first transistor and said inductive element;
a second DC blocking capacitor coupled to said fifth terminal of said second transistor and said inductive element.

31. The voltage controlled oscillator of claim 27 further comprising:
a first capacitor coupled between said first variable capacitance element and said first inductor;
a second capacitor coupled between said second variable capacitance element and said second inductor.

32. A differential oscillator comprising:
(a) a low impedance element comprising a resistor;
(b) a first oscillator including
a first resistance element coupled to ground;
a first capacitance element;
a second capacitance element coupled to ground;
a first inductive element;
a first transistor including a first terminal, a second terminal and a third terminal; said first terminal is coupled to a voltage source; said second terminal is coupled to said first inductive element and to said first capacitance element; and said third terminal is coupled to said first resistive element, said first capacitance element and said second capacitance element;
(c) a second oscillator that is a mirror image of said first oscillator and coupled to said first oscillator at a plane of symmetry, said second oscillator including a second resistance element coupled to ground;
a third capacitance element;
a fourth capacitance element coupled to ground;
a second inductive element;
a second transistor including a fourth terminal, a fifth terminal and a sixth terminal;
said fourth terminal is coupled to said voltage source; said fifth terminal is coupled to said second inductive element and to said third capacitance element; and said sixth terminal is coupled to said second resistive element, said third capacitance element and said fourth capacitance element;

wherein said low impedance element is located at said plane of symmetry between said first oscillator and said second oscillator.

33. The differential oscillator of claim 32 wherein said low impedance element is shared between said first oscillator and said second oscillator.

34. The differential oscillator of claim 32 wherein said first inductive element and said second inductive element form a single inductor such that said first oscillator and said second oscillator share said single inductor.

35. A differential oscillator comprising:
first and second single-ended output oscillators which generally correlate with one another and which are coupled through a coupling network, wherein the coupling network comprises a cross-coupled transformer; and
a differential output formed from the single-ended outputs of the first and second oscillators.

36. The differential oscillator of claim 35 wherein the first and second oscillators are Colpitts oscillators.

37. The differential oscillator of claim 35 wherein the coupling network comprises inductors from each of the first and second oscillators.

38. The differential oscillator of claim 35 wherein the coupling network comprises an inductor and a resistive element coupled at one end to a voltage source and at the other end to the inductor.

39. The differential oscillator of claim 38 wherein the resistance of the resistive element is such as to eliminate or reduce common mode oscillation.

40. A differential oscillator comprising:
first and second single-ended output oscillators which generally correlate with one another and which are coupled through a coupling network, wherein the coupling network is configured to reduce or eliminate common mode oscillation; and
a differential output formed from the single-ended outputs of the first and second oscillators.

41. A differential oscillator comprising:
first and second single-ended output oscillators which generally correlate with one another and which are coupled through a coupling network, wherein the coupling network comprises first and second inductors coupled at a node, and a resistive element coupled at one end to a power supply and at the other end to the node; and
a differential output formed from the single-ended outputs of the first and second oscillators.

42. The differential oscillator of claim 41 wherein the resistance of the resistive element is such as to eliminate or reduce common mode oscillation.

* * * * *